United States Patent
Lin et al.

(10) Patent No.: US 6,428,938 B1
(45) Date of Patent: Aug. 6, 2002

(54) PHASE-SHIFT MASK FOR PRINTING HIGH-RESOLUTION IMAGES AND A METHOD OF FABRICATION

(75) Inventors: Chin-Hsiang Lin, Kaohsiung; Shy-Jay Lin, Taipei; Sheng-Chi Chin, Hsin-Chu; Wei-Zen Chou, Taipei, all of (TW)

(73) Assignee: Taiwan Semiconductor Manufacturing Company, Hsins-Chu (TW)

( * ) Notice: Subject to any disclaimer, the term of this patent is extended or adjusted under 35 U.S.C. 154(b) by 24 days.

(21) Appl. No.: 09/596,900

(22) Filed: Jun. 19, 2000

(51) Int. Cl.$^7$ .............................. G03F 9/00; G03C 5/00
(52) U.S. Cl. ........................ 430/5; 430/296; 430/394
(58) Field of Search ..................... 430/5, 322, 394, 430/296; 716/19, 21; 250/492.22

(56) References Cited

U.S. PATENT DOCUMENTS

| | | | |
|---|---|---|---|
| 5,541,025 A | 7/1996 | Oi et al. | 430/5 |
| 5,700,731 A | 12/1997 | Lin et al. | 438/381 |
| 5,702,847 A | 12/1997 | Tarumoto et al. | 430/5 |
| 5,761,075 A | 6/1998 | Oi et al. | 364/488 |
| 5,786,114 A | 7/1998 | Hashimoto | 430/5 |
| 6,159,642 A | * 12/2000 | Kawano et al. | 430/5 |

* cited by examiner

*Primary Examiner*—S. Rosasco
(74) *Attorney, Agent, or Firm*—George O. Saile; Stephen B. Ackerman

(57) ABSTRACT

An improved phase-shift photomask and method of fabrication are described. The method for making this phase-shift mask involves depositing an opaque film, such as chromium (Cr), on a transparent plate, such as $SiO_2$ (quartz plate). An electron beam photoresist layer is deposited on the Cr film and is partially exposed in regions A and completely exposed in closely spaced alternate regions B by an electron beam. The exposed photoresist is then developed. The Cr film is etched in regions B while the remaining resist in regions A protect the Cr from etching. The e-bean resist is plasma etched back to remove the resist over regions A and then the quartz plate in regions B is recessed to a depth d by plasma etching while the Cr protects the quartz in regions A from etching. The recess is etched to a depth to provide an optical path difference between A and B of ½ wavelength (180°) when UV light is transmitted through the mask to expose resist on a product substrate. This 180° phase-shift minimizes the diffracted light under the Cr film between regions A and B and improves the DOF and therefore the photoresist resolution. Since a single e-beam resist is used to make the mask it is more manufacturing cost effective with improved alignment accuracy between regions A and B.

18 Claims, 5 Drawing Sheets

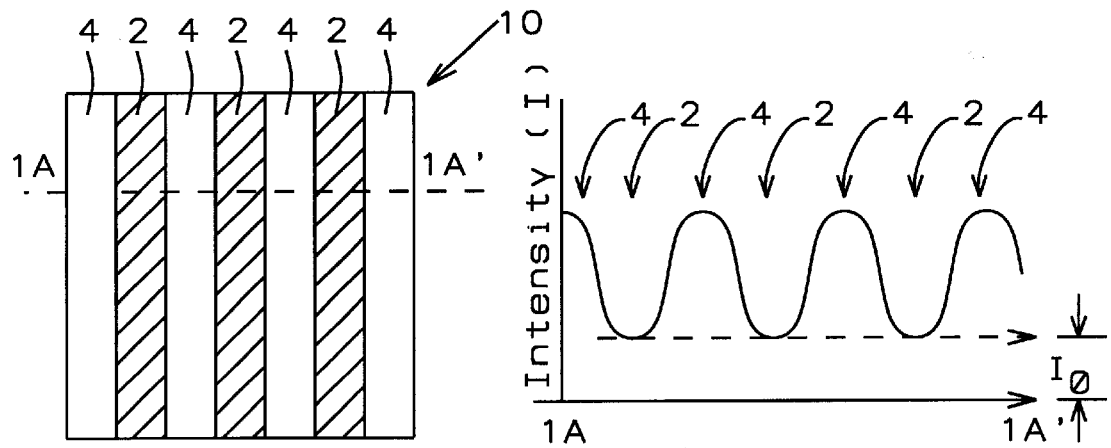
FIG. 1A - Prior Art    FIG. 1B - Prior Art
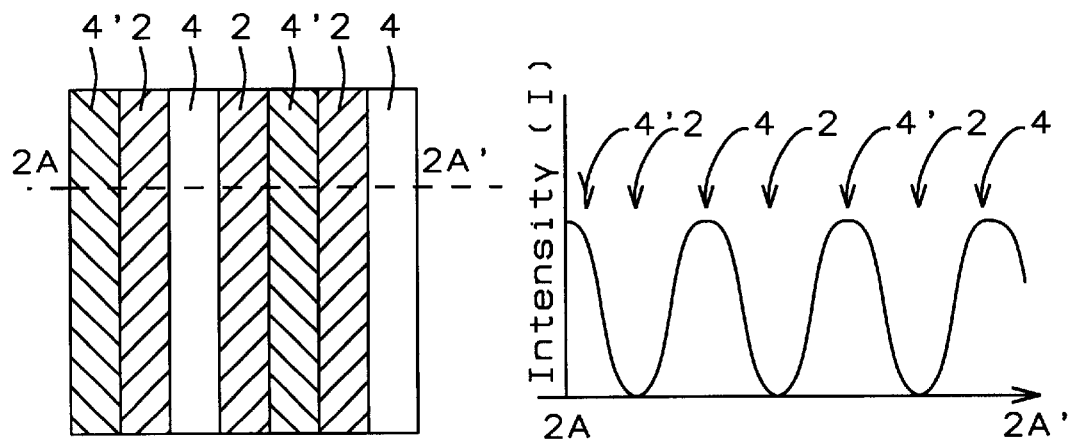
FIG. 2A - Prior Art    FIG. 2B - Prior Art

PHASE-SHIFT MASK FOR PRINTING HIGH-RESOLUTION IMAGES AND A METHOD OF FABRICATION

BACKGROUND OF THE INVENTION (1) Field on the Invention

The present invention relates to a phase-shift photomask (reticle) and a method of fabrication for printing high-resolution images in photoresist, and more particularly to a phase-shift photomask for making closely spaced active areas, plug contacts, and capacitors for high density Dynamic Random Access Memory (DRAM) cells on semiconductor substrates.

(2) Description of the Prior Art

Photolithographic techniques are used to pattern material layers on semiconductor substrates, such as silicon substrates, for making integrated circuits. In these techniques a photoresist layer is coated on a product substrate. The photoresist is then exposed through a photoresist mask, for example a reticle (hereafter referred to simply as a mask), that is stepped across the product substrate (wafer) and a short wavelength radiation, such as ultraviolet (UV) light, is used to expose the photoresist. Typically the mask is composed of a fused silica (commonly referred to as quartz) plate having a patterned opaque layer, such as a thin chromium (Cr) film. After exposing the photoresist on the product wafer through the mask, the photoresist is then developed to define patterns that are used in subsequent processing steps, for example as plasma etch masks, to fabricate the integrated devices. The photoresist mask and etching are used to pattern semiconductor material layers, such as silicon oxide, polysilicon, suicides, and metals on the semiconductor substrate.

As the circuit density continues to increase, such as for ultra-large-scale integration (ULSI), it is necessary to form photoresist patterns having spacings that are less than the exposure wavelength (lambda) of the UV radiation used to expose the photoresist. As is well known in the physical sciences, because of the wave nature of light, diffraction occurs at the edge of the image of the opaque film (Cr film). This diffraction results in the propagation of the light underneath the edge of the patterned Cr film, which limits the resolution when the photoresist layer on the product wafer is exposed through the mask.

To better appreciate this problem, an enlarged top view of a portion of a conventional photomask 10, having alternating transparent areas 4 and opaque areas 2, is shown in FIG. 1A. The opaque areas 2 are formed by patterning a thin Cr layer on the optically transparent quartz plate, also labeled 10. The transparent regions 4 are through the quartz plate where the Cr is removed. Typically the Cr is patterned using a photoresist layer that is exposed using an electron beam (e-beam) exposure tool. Because of the short wavelength associated with the electron beam, it provides a high resolution image that is not achieved using a longer wavelength UV. After developing the e-beam photoresist and patterning the Cr film by etching, the mask is used to expose product wafers using UV light.

When UV light is projected through the mask 10 of FIG. 1A to expose the photoresist on a product substrate, the UV light intensity I varies across the pattern. FIG. 1B shows the variation in the light intensity I across the mask as depicted for 1A–1A' in FIG. 1A. As shown in FIG. 1B, the light intensity I is a maximum in the transparent regions 4 but does not decrease to zero in the opaque areas 2 because of the constructive interference of the diffracted light at the edge of the opaque areas 2. Since the diffracted light under the opaque areas 2 arrives in phase from adjacent transparent areas 4, the intensity I is not zero but has a finite value $I_o$. Therefore as the image width decreases, it is difficult to expose and develop a high-resolution pattern in the photoresist on the product substrate.

One method of reducing the diffracted light under the narrow opaque regions is described in the reference entitled "Improved Resolution in Photolithography with a Phase-Shifting Mask" by M. D. Levenson et al. published in the IEEE Trans. on Elec. Devices, Vol. ED-29, No. 12 December, 1982, page 1828. To better understand using phase-shift masks, one approach is depicted in FIG. 2A. As shown in FIG. 2A, the method involves forming alternating transparent areas 4' that are 180° out of phase with the adjacent areas 4. When UV light is projected through the mask 10 to expose the photoresist on the silicon substrate, the UV light intensity I varies across the pattern through the cross section 2A–2A', as shown in FIG. 2B. The transmitted UV light intensity I is a maximum in the transparent regions 4 and 4' but the UV intensity $I_o$ is essentially zero under the opaque areas 2 because of the destructive interference of the diffracted light from adjacent transparent areas 4 and 4' which have a difference in phase of 180°.

Other methods of making phase-shift photomasks have been reported. In U.S. Pat. No. 5,700,731 to Lin et al. a method is described for making capacitor bottom electrodes using adjacent regions on a phase-shift mask that have a phase shift of 180° to expose a photoresist layer. However, Lin et al. do not address the problem of closely spaced openings on a mask that results in poor depth of focus (DOF) due to the diffracted light under the opaque regions. Oi et al. in U.S. Pat. Nos. 5,541,025 and 5,761,075 teach a method of designing layouts for phase-shifting masks to compact the layout of the circuit elements without violating the design ground rule. Oi et al. do not teach a method for making the phase-shift mask. In U.S. Pat. No. 5,786,114 to Hashimoto, a method is described for making halftone attenuated phase-shift masks in which the phase-shift layer at the boundary regions of the mask is removed to reduce the light scattering between adjacent chip areas on the product substrate without requiring an additional opaque boundary area. However, Hashimoto does not address the problem associated with diffracted light between closely spaced transparent openings at the edges of a patterned opaque layer. In U.S. Pat. No. 5,702,847 to Tarumoto et al., a method is described for forming an attenuated phase-shift mask on an optically transmissive substrate and then they describe a method of using the halftone layer on the perimeter of the mask to minimize the transmittance of the radiation. This improves product reliability and turn-around time (TAT).

However, there is still a strong need in the semiconductor industry to fabricate phase-shift masks using a simplified process that is more manufacturing cost effective with greater DOF for improved photoresist resolution. These phase-shift masks are particularly useful for increasing the memory cell density on future DRAM devices having smaller dimensions.

SUMMARY OF THE INVENTION

A principal object of the present invention is to provide a phase-shift mask and a method for making this phase-shift mask for exposing photoresist with improved resolution for semiconductor devices having sub-micron dimensions, and more specifically for forming photoresist images having an improved Depth Of Focus (DOF) for active areas, plug areas, and capacitor areas on DRAM devices.

Another object of this invention is to make these phase-shift masks having patterned chrome (opaque) areas and alternate recessed areas on a fused silica plate (commonly referred to as a quartz plate) that form part of the phase-shift mask (reticle).

Still another object of this invention is to use a single photoresist masking step to reduce manufacturing cost.

This invention features a novel phase-shift photomask and a method of fabrication for improving the depth of focus (DOF) for exposing closely spaced patterns in photoresist on a product (semiconductor) substrate. This novel mask is particularly useful for making arrays of closely spaced patterns for the active device areas, polysilicon plugs, and capacitors for memory cell areas on DRAM devices. The phase-shift photomask structure minimizes diffraction at the edge of the opaque patterns resulting in greater DOF and higher resolution when the photoresist on the semiconductor substrate is exposed through the photomask. The method of making these phase-shift masks consists of providing a transparent plate, such as silicon oxide ($SiO_2$), and more specifically a fused silica which is commonly referred to as a quartz plate. An opaque layer is deposited on the transparent plate. Typically the opaque layer is a thin film of chromium (Cr) deposited, for example, by sputter deposition. A photoresist layer is deposited on the opaque layer by spin coating. The photoresist layer is then exposed using an electron beam (e-beam) system to form an array of images. The e-beam dose and electron energy are adjusted during exposure to partially expose (semi-expose) images A while fully exposing the photoresist to form alternate images B. The photoresist is then developed to completely remove the photoresist in the images B thereby exposing the Cr layer in the images B while retaining portions of the photoresist in images A to protect the Cr from etching. The Cr layer is removed from the plate in the regions B. The Cr is removed by wet etching. The photoresist on the plate is plasma etched in oxygen ($O_2$) to remove the remaining photoresist in regions A while retaining the photoresist elsewhere on the photomask. Next, a plasma etch using, for example, $CF_4$ or $CHF_3$, is carried out to selectively etch regions B of the transparent plate, while the Cr in regions A and photoresist protect the remaining transparent plate (photomask) from etching. By the method of this invention, the regions B are recessed to a depth d that provides a phase shift of 180° when UV light is later transmitted through the photomask to expose photoresist on semiconductor substrates. The method of making the photomask continues by selectively removing the opaque Cr layer in regions A using wet etching. Then the remaining photoresist is removed to complete the phase-shift mask. Therefore a phase-shift mask is formed using a single photoresist mask in which alternating adjacent regions A and B have an optical path length with a 180° phase shift. The diffracted light at the edges of the Cr pattern through regions A and B is 180° out of phase and therefore results in destructive interference and minimizes the optical exposure under the Cr pattern resulting in a greater DOF and improved photoresist resolution.

By a second embodiment, the above photomask is subjected to an additional plasma etch which recesses the transparent plate in regions A and B while retaining the difference in depth d between regions A and B. This additional etch results in a better balance in light intensity distribution between the regions A and B.

BRIEF DESCRIPTION OF THE DRAWINGS

The accompanying drawings that are included with the preferred embodiments are now briefly described.

FIG. 1A is a top view of a conventional photomask of the prior art having an array of closely spaced opaque lines.

FIG. 1B shows the profile of the light intensity transmitted through the conventional photomask of FIG. 1A as a function of position across the array of opaque lines.

FIG. 2A is a top view of a phase-shift mask of the prior art having an array of opaque lines with alternate spaces having a phase shift of 180°.

FIG. 2B shows the profile of the light intensity transmitted through the phase-shift mask of FIG. 2A as a function of position across the array of opaque lines.

DESCRIPTION OF THE PREFERRED EMBODIMENTS

Now in keeping with the objects of this invention, a first embodiment for manufacturing a novel phase-shift mask is described in detail. This invention features a novel phase-shift photomask and a method of fabrication for improving the depth of focus (DOF) for exposing closely spaced patterns in photoresist on a semiconductor substrate. This novel mask is particularly useful for making arrays of closely spaced patterns for the active device areas, polysilicon plugs, and capacitors for memory cell areas on DRAM devices. The phase-shift photomask structure minimizes diffraction at the edge of the opaque patterns resulting in greater DOF and higher resolution when the photoresist on the semiconductor substrate is exposed through the photomask. Although the method is described for making an array of high-density memory cells for DRAM devices, it should be understood by one skilled in the art that the method is generally applicable for making closely spaced patterns on semiconductor circuits in general.

Figure 3:
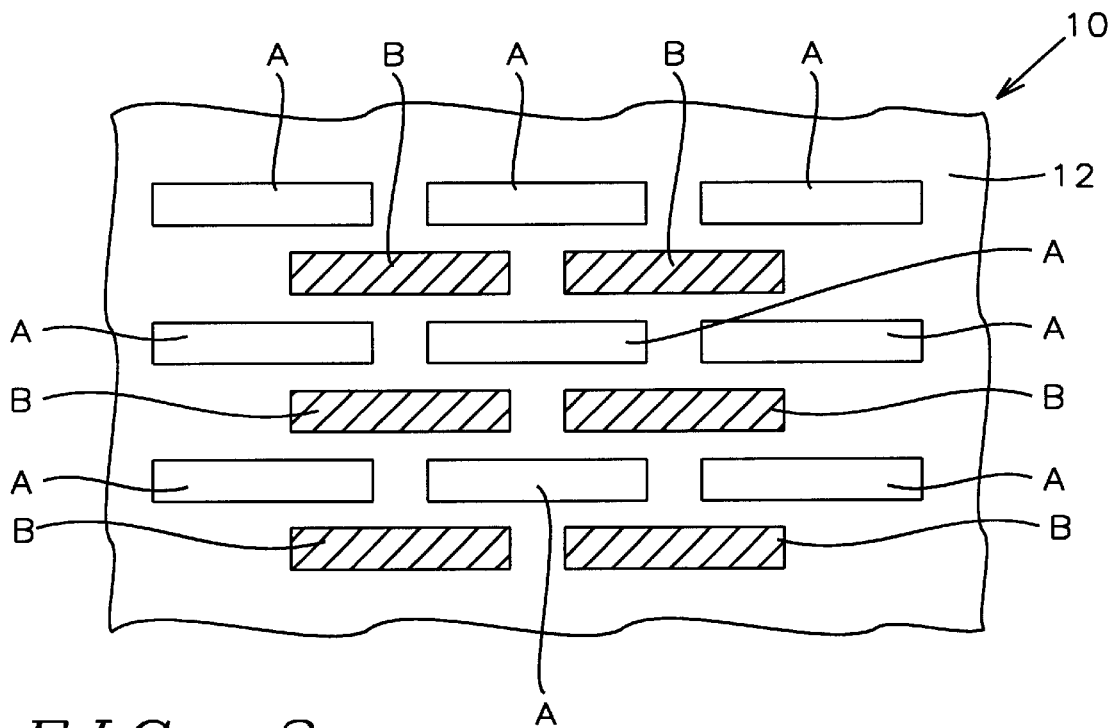
FIG. 3 is a schematic top view of a phase-shift mask, by the method of this invention, for printing a dense array of active device areas on a memory cell area of a DRAM.
Figure 4:
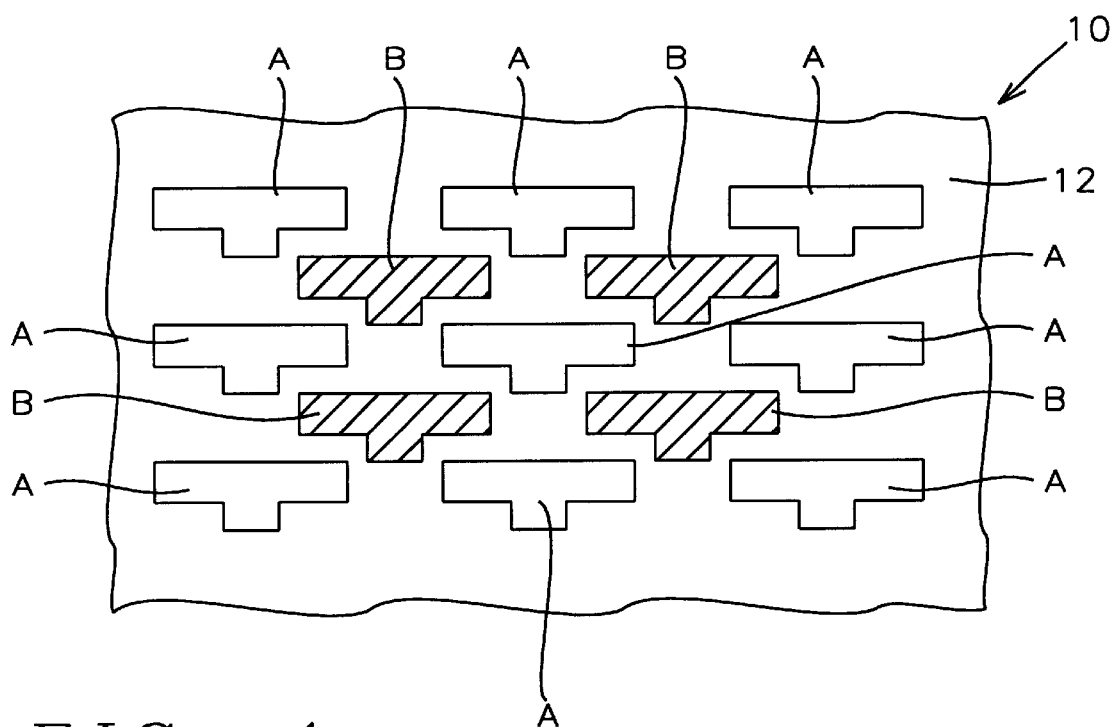
FIG. 4 is a schematic top view of a phase-shift mask, by the method of this invention, for printing a dense array of plugs on the memory cell area of a DRAM.
Figure 5:
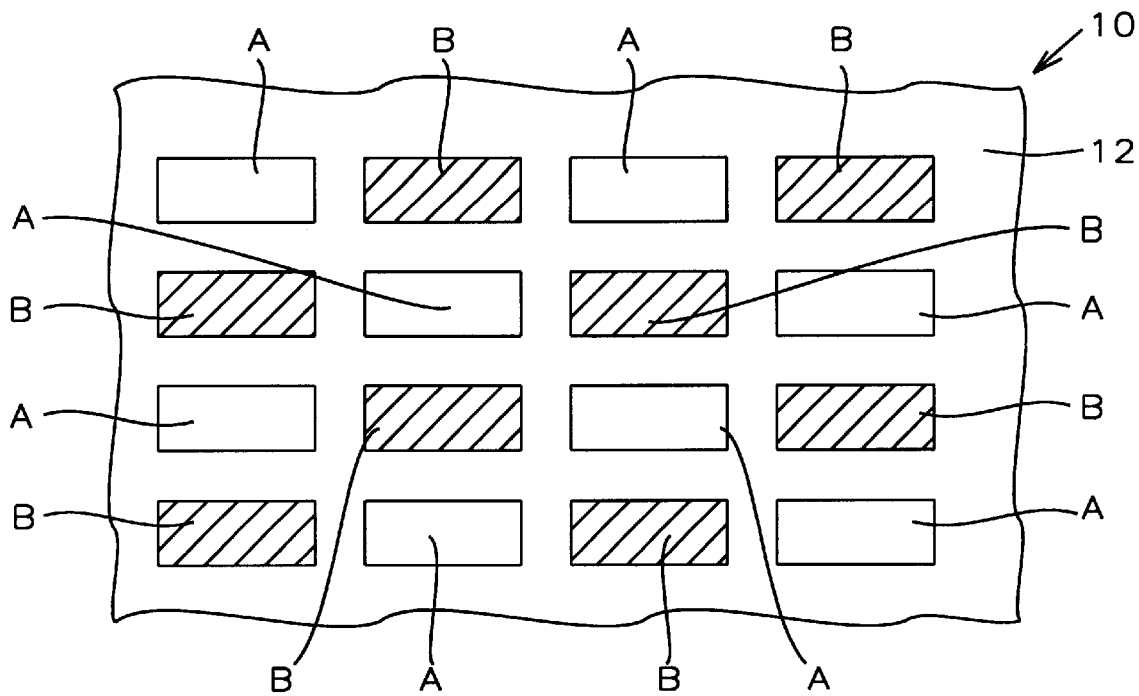
FIG. 5 is a schematic top view of a phase-shift mask, by the method of this invention, for printing a dense array of capacitors on the memory cell area of a DRAM.

Prior to describing the method for making these improved phase-shift masks, the top views of FIGS. 3–5 show, respectively, the preferred layout arrangements for an array of active areas, an array of self-aligned contact openings for conducting plugs, and an array of openings for making closely spaced capacitor bottom electrodes for a DRAM device. FIGS. 3–5 are now described only briefly since the method of making the phase-shift mask is described in detail below with respect to FIGS. 6–15.

Referring to FIG. 3, an enlarged top view of a portion of the phase-shift mask for defining the array of active device areas is depicted. The mask consists of a transparent plate 10, which is typically a quartz plate. A patterned opaque layer 12 (e.g., Cr) having openings A and B in the active device areas is formed on the quartz plate 10. The quartz plate 10 is recessed in the alternating rows of openings B to provide a phase shift of 180° with respect to the openings A when UV light is used to expose the photoresist on a product wafer. FIG. 4 shows the design layout of the phase-shift mask for defining an array of self-aligned contact openings for conducting plugs. Openings A and B are formed in the opaque layer 12 on the quartz plate 10. The alternating openings B are recessed to provide a phase shift of 180° with respect to the openings A when UV light is used to expose the photoresist on a product wafer. FIG. 5 shows the design layout of the phase-shift mask for defining an array of openings for making closely spaced capacitor bottom electrodes for a DRAM device. Openings A and B are formed in the opaque layer 12 on the quartz plate 10. The alternating openings B are recessed to provide a phase shift of 180° with respect to the openings A. When UV light is used to expose the photoresist on a product wafer, the UV light transmitted through openings A and B is out of phase by 180° and results in a minimum light intensity under the opaque regions 12.

Figure 6:
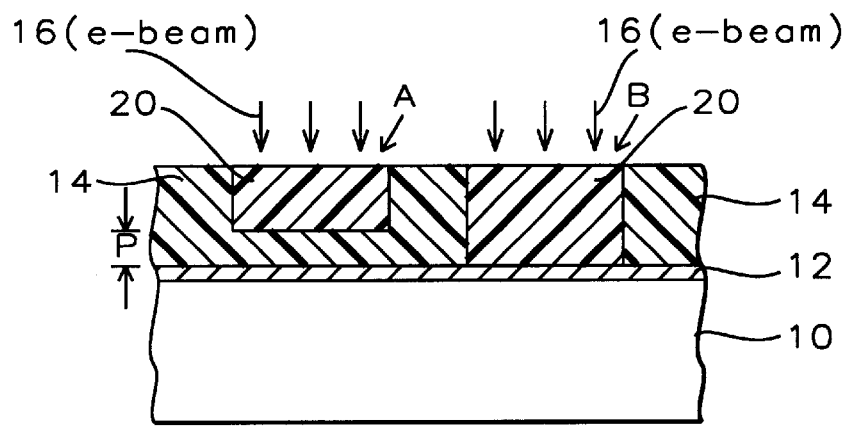
FIGS. 6 through 12 show schematic cross-sectional views for making the phase-shift mask by the method of this invention.

Referring now to FIG. 6, the detailed method of making these phase-shift masks consists of providing a transparent plate 10. Typically the plate 10 is composed of $SiO_2$. More specifically, the plate 10 is a fused silica and is commonly referred to as a quartz plate in the industry. After optically polishing the plate, an opaque layer 12 is deposited on a surface of the transparent plate 10. Typically the opaque layer 12 is a thin film of Cr. For example, the Cr layer 12 can be deposited in a sputter deposition tool by inert sputter deposition by using argon (Ar) to sputter Cr from a sputtering target onto the plate 10. Typically the Cr film 12 is deposited to a thickness of between about 400 and 1000 Angstroms. An electron-beam (e-beam) photoresist layer 14 is deposited by spin coating on the thin Cr layer 12. The e-beam photoresist can be one of a variety of e-beam-sensitive resists, such as ZEP type resist manufactured by Nippon Zeon Company, Ltd. of Japan. The photoresist 14 is typically spin coated to a thickness of between about 6000 and 10000 Angstroms. The photoresist layer is then exposed using an e-beam system to form an array of images, as shown in the top views of FIGS. 3–5. The e-beam dose and electron energy are adjusted during exposure to partially expose (semi-expose) images 18 in region A while fully exposing alternate images 20 in the photoresist in region B, as shown in FIG. 6 and in the top views of FIGS. 3–5.

Figure 7:
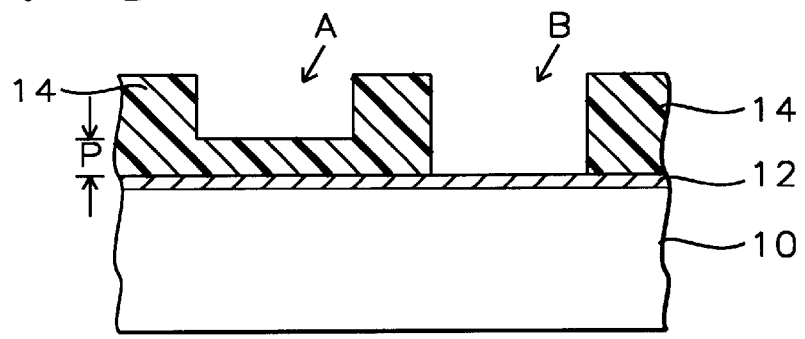

Referring to FIG. 7, the exposed photoresist 18 and 20 is then developed to completely remove the photoresist in the regions B thereby exposing the Cr layer 12 while retaining portions P of the photoresist in the regions A to protect the Cr 12 during subsequent etching.

Figure 8:
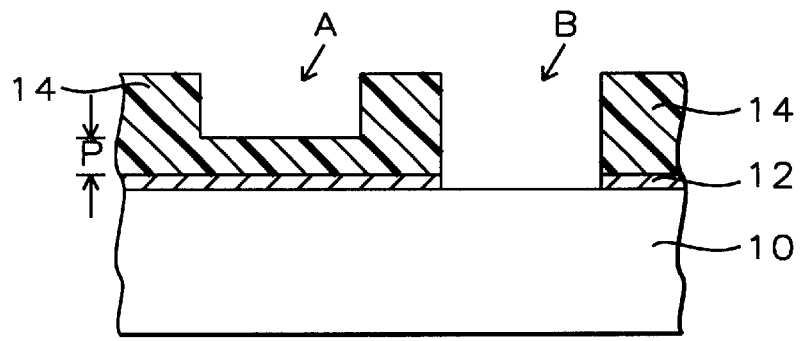

Referring to FIG. 8, the exposed Cr layer 12 in regions B is removed from the quartz plate 10, while the photoresist layer 14, including the portions P, protects the remaining Cr from etching. The Cr 12 is preferably removed by wet etching in a solution of ceric ammonium nitrate $Ce(NH_4)_2(NO_3)_6$.

Figure 9:
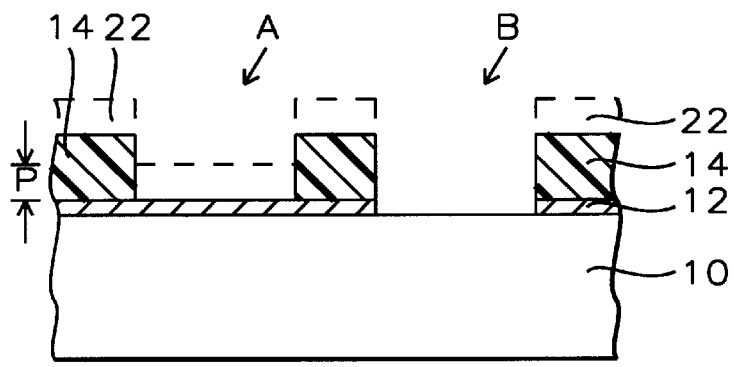

Referring next to FIG. 9, the remaining photoresist on the quartz plate is plasma etched to remove a portion of the photoresist 14, as depicted by the dashed line 22, which includes the portion P in region A, while retaining the photoresist 14 elsewhere on the plate. The photoresist is removed using reactive ion etching (RIE) and oxygen ($O_2$) as the etchant gas.

Figure 10:
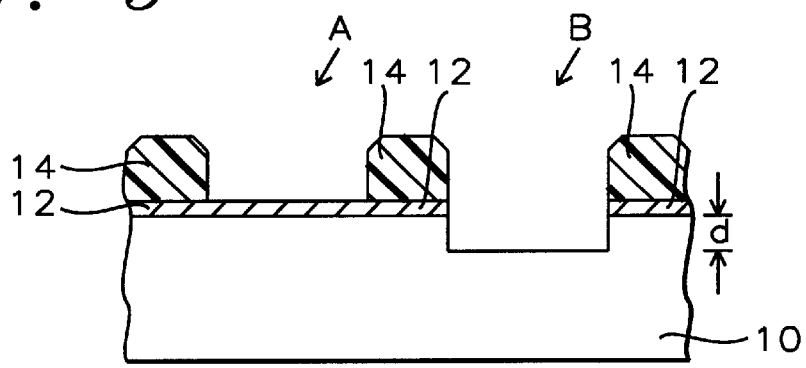

Referring to FIG. 10, a key feature of this invention is to recess the quartz plate 10 in region B to a depth d, where d=lambda/[(2(n−1)], and where lambda is the wavelength of the UV radiation when the mask is completed and is used to expose the photoresist on product wafers, and n is the index of the quartz plate. This depth d provides a phase-shift difference of 180°. Preferably the recess having a depth d is etched using plasma etching and a fluorine-containing etchant gas such as $CF_4$ or $CHF_3$ to selectively etch regions B of the transparent plate 10. The Cr 12 in regions A and the remaining photoresist 14 protect the transparent quartz plate 10 from etching.

Figure 11:
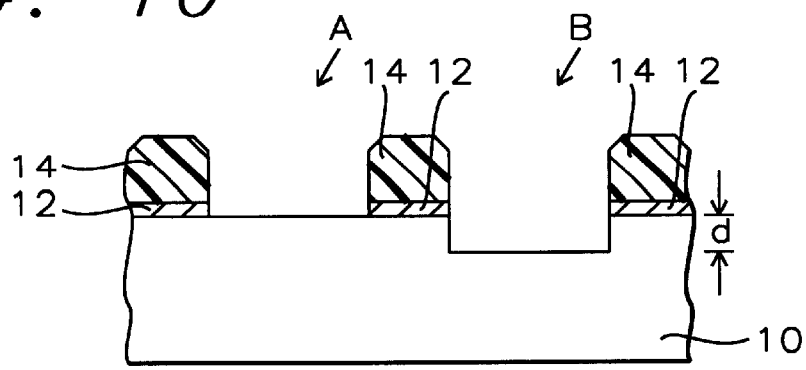

Referring to FIG. 11, the opaque Cr layer 12 in regions A is then selectively removed to the quartz plate 10 by wet etching. The wet etching is preferably carried out using a solution of ceric ammonium nitrate $(Ce(NH_4)_2(NO_3)_6)$.

Figure 12:
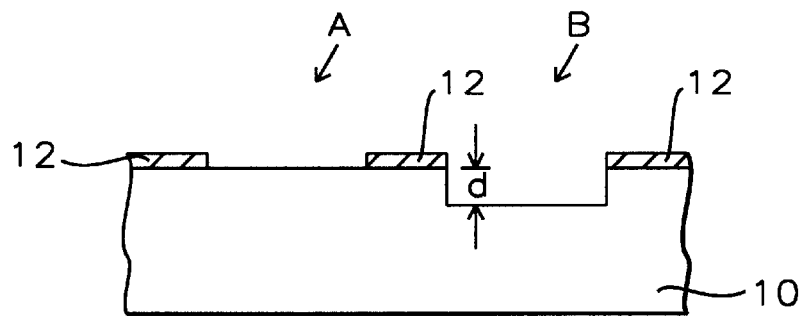

Referring now to FIG. 12, the remaining photoresist layer 14 is removed, for example by plasma ashing in $O_2$ and/or by wet stripping in an appropriate photoresist stripper (solution) to complete this novel phase-shift mask.

Figure 14:
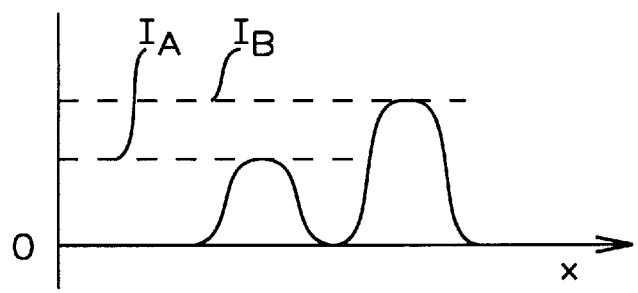
FIGS. 14 and 15 show profiles for the light intensity through the phase-shift mask of the first and second embodiments, respectively.

Since a single e-beam photoresist layer is used, the process for making the mask is more cost effective and misalignment between multiple masking levels is avoided. When photoresist on a product wafer is exposed with UV light through this phase-shift mask, the diffracted light through regions A and B at the edges of the Cr pattern 12 is 180° out of phase. Because of the wave nature of light, the optical interference results in destructive interference that minimizes the light intensity under the Cr pattern resulting in a greater DOF and improved photoresist resolution. However, as shown in FIG. 14, although the diffracted light intensity I is reduced essentially to zero under the patterned Cr areas between the openings A and B, there is a slight imbalance in the light intensity IA and IB in the openings A and B.

Figure 13:
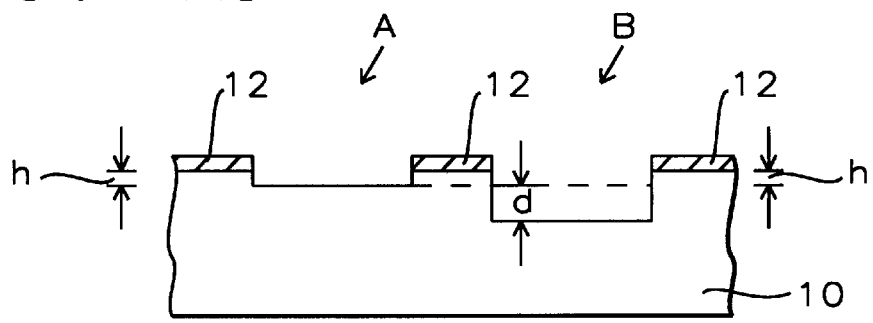
FIG. 13 shows a schematic cross-sectional view of a second embodiment of the invention.
Figure 15:
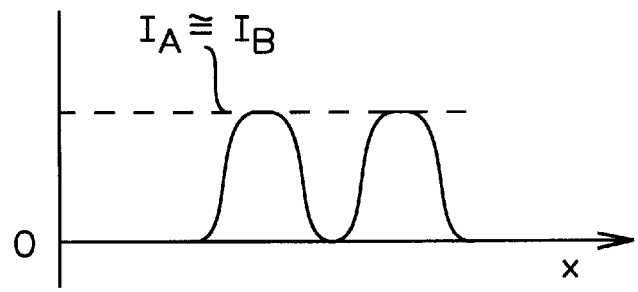

Referring to FIG. 13, a second embodiment of this invention is described which improves this imbalance in light intensity (I) depicted in FIG. 15. The process steps are identical to the first embodiment up to and including the process steps depicted in FIG. 11. In the second embodiment, prior to removing the photoresist 14 the quartz plate 10 in the open regions A and B is further recessed to a depth h of between about 500 and 1500 Angstroms. This results in a more balanced intensity (IB=IA) as shown in FIG. 15, while the optical path difference between open regions A and B is retained.

While the invention has been particularly shown and described with reference to the preferred embodiments thereof, it will be understood by those skilled in the art that various changes in form and details may be made without departing from the spirit and scope of the invention.

What is claimed is:

1. A method for fabricating phase-shift masks comprising the steps of:
   providing a transparent plate;
   depositing an optically opaque blanket layer on said transparent plate;
   depositing a photoresist layer on said opaque layer;
   partially exposing said photoresist layer to form images in regions A while fully exposing said photoresist in alternating regions B;
   developing said photoresist to completely remove said photoresist in said regions B thereby exposing said opaque layer while retaining portions of said photoresist in said regions A;
   etching said opaque layer in said regions B to said transparent plate;
   plasma etching said photoresist and removing said portions of said photoresist in said regions A;
   plasma etching to recess said transparent plate in said regions B to form a phase-shift mask;

etching selectively said opaque layer in said regions A and removing said photoresist to complete said phase-shift mask.

2. The method of claim 1, wherein said transparent plate is silicon dioxide and has a thickness of between about 5 and 7 millimeters.

3. The method of claim 1, wherein said opaque layer is chromium and is deposited to a thickness of between about 400 and 1000 Angstroms.

4. The method of claim 3, wherein said chromium is removed by wet etching in a solution of ceric ammonium nitrate.

5. The method of claim 1, wherein said photoresist layer is exposed using an electron beam system wherein a first dose is adjusted to partially expose said photoresist in said regions A, and a second dose is used to completely expose said photoresist in said regions B.

6. The method of claim 1, wherein said portions of said photoresist in said regions A are removed using reactive ion etching with oxygen.

7. The method of claim 1, wherein said transparent plate is recessed using plasma etching and a fluorine-containing etchant.

8. The method of claim 1, wherein said recess in said transparent plate is etched to a depth to change the optical path to provide a phase shift of 180° between said regions A and said regions B when said masks are used to expose semiconductor substrates.

9. A method for fabricating phase-shift masks comprising the steps of:

providing a transparent plate;

depositing an optically opaque blanket layer on said transparent plate;

depositing a photoresist layer on said opaque layer;

partially exposing said photoresist layer to form images in regions A while fully exposing said photoresist in alternating regions B;

developing said photoresist to completely remove said photoresist in said regions B thereby exposing said opaque layer while retaining portions of said photoresist in said regions A;

etching said opaque layer in said regions B to said transparent plate;

plasma etching said photoresist and removing said portions of said photoresist in said regions A;

recessing said transparent plate by plasma etching in said regions B to form a phase-shift mask;

etching selectively said opaque layer in said regions A; and concurrently further recessing said regions A and B to alter light intensity in said regions A and B when exposing a product substrate through said phase-shift mask;

removing said photoresist to complete said phase-shift mask.

10. The method of claim 9, wherein said transparent plate is silicon dioxide and has a thickness of between about 5 and 7 millimeters.

11. The method of claim 9, wherein said opaque layer is chromium and is deposited to a thickness of between about 400 and 1000 Angstroms.

12. The method of claim 11, wherein said chromium is removed by wet etching in a solution of ceric ammonium nitrate.

13. The method of claim 9, wherein said photoresist layer is exposed using an electron beam system wherein a first dose is adjusted to partially expose said photoresist in said regions A, and a second dose is used to completely expose said photoresist in said regions B.

14. The method of claim 9, wherein said portions of said photoresist in said regions A are removed using reactive ion etching with oxygen.

15. The method of claim 9, wherein said transparent plate is recessed using plasma etching and a fluorine-containing etchant.

16. The method of claim 9, wherein said recess in said transparent plate is etched to a depth to change the optical path to provide a phase shift of 180° between regions A and regions B when said masks are used to expose semiconductor substrates.

17. The method of claim 9, wherein said concurrent further etching of said regions A and B equalizes the radiation intensity distribution between said regions A and B.

18. The method of claim 9, wherein said phase-shift masks having said regions A and B are used for making active device areas, openings for capacitors, and openings for conducting plugs for dynamic random access memory.

* * * * *